United States Patent
Flaugh et al.

(10) Patent No.: US 12,272,558 B2
(45) Date of Patent: Apr. 8, 2025

(54) SELECTIVE AND ISOTROPIC ETCH OF SILICON OVER SILICON-GERMANIUM ALLOYS AND DIELECTRICS; VIA NEW CHEMISTRY AND SURFACE MODIFICATION

(71) Applicant: TOKYO ELECTRON LIMITED, Tokyo (JP)

(72) Inventors: Matthew Flaugh, Albany, NY (US); Jonathan Hollin, Albany, NY (US); Subhadeep Kal, Albany, NY (US); Pingshan Luan, Albany, NY (US); Hamed Hajibabaeinajafabadi, Albany, NY (US); Yu-Hao Tsai, Albany, NY (US); Aelan Mosden, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 294 days.

(21) Appl. No.: 17/964,601

(22) Filed: Oct. 12, 2022

(65) Prior Publication Data

US 2023/0360921 A1 Nov. 9, 2023

Related U.S. Application Data

(60) Provisional application No. 63/339,895, filed on May 9, 2022.

(51) Int. Cl.
*H01L 21/3065* (2006.01)
*H01L 21/308* (2006.01)
(Continued)

(52) U.S. Cl.
CPC ...... *H01L 21/3065* (2013.01); *H01L 21/3081* (2013.01); *H01L 21/02057* (2013.01);
(Continued)

(58) Field of Classification Search
CPC ............. H01L 21/3065; H01L 21/3081; H01L 21/02057; H01L 21/02247; H01L 21/02252; B82Y 10/00
See application file for complete search history.

(56) References Cited

U.S. PATENT DOCUMENTS 9,984,890 B2 * 5/2018 Kal ................... H01L 21/30604
11,424,120 B2 * 8/2022 Luan ................... H01L 21/0234
(Continued)

OTHER PUBLICATIONS

International Search Report and Written Opinion for PCT/US2023/016397 dated Jul. 20, 2023.

*Primary Examiner* — Anita K Alanko
(74) *Attorney, Agent, or Firm* — Slater Matsil, LLP (57) ABSTRACT

Selective protection and etching is provided which can be utilized in etching of a silicon containing layer with respect to a Ge or SiGe layer. In an example, the layers are stacked, and an oxide is on a side surface of the layers. A treatment is utilized to provide a modified surface or termination surface on side surfaces of the Ge/SiGe layers, and a heat treatment is provided after the gas treatment to selectively sublimate layer portions on side surfaces of the Si containing layers. The gas treatment and heat treatment are preferably in non-plasma environments. Thereafter, a plasma process is performed to form a protective layer on the Ge containing layers, and the Si containing layers can be etched with the plasma.

20 Claims, 7 Drawing Sheets

(51) Int. Cl.
      *H01L 21/02*         (2006.01)
      *H01L 29/06*         (2006.01)
      *H01L 29/417*        (2006.01)
      *H01L 29/423*        (2006.01)

(52) U.S. Cl.
      CPC .... *H01L 29/0673* (2013.01); *H01L 29/41775* (2013.01); *H01L 29/42392* (2013.01)

(56) References Cited

U.S. PATENT DOCUMENTS

| | | | |
|---|---|---|---|
| 11,482,423 B2* | 10/2022 | Luan | H01L 21/02252 |
| 11,538,690 B2* | 12/2022 | Luan | H01L 21/32137 |
| 11,837,467 B2* | 12/2023 | Luan | H01L 21/31144 |
| 12,002,683 B2* | 6/2024 | Hajibabaeinajafabadi | H01L 29/42392 |
| 2007/0238302 A1* | 10/2007 | Dip | H01L 21/02046 438/720 |
| 2014/0113459 A1* | 4/2014 | Kaufman-Osborn | H01L 21/28255 438/796 |
| 2016/0307765 A1 | 10/2016 | Ze et al. | |
| 2016/0379835 A1 | 12/2016 | Kal et al. | |
| 2017/0194430 A1* | 7/2017 | Wood | H01L 29/0673 |
| 2017/0271165 A1 | 9/2017 | Subhadeep et al. | |
| 2020/0027741 A1* | 1/2020 | Kal | H01L 21/3065 |
| 2020/0098575 A1 | 3/2020 | Nobuhiro et al. | |
| 2020/0266070 A1* | 8/2020 | Voronin | H01L 21/02532 |
| 2021/0335626 A1 | 10/2021 | Jun et al. | |
| 2024/0055268 A1* | 2/2024 | Otto, IV | H01L 21/0217 |
| 2024/0055270 A1* | 2/2024 | Otto, IV | H01L 21/0234 |
| 2024/0096639 A1* | 3/2024 | Hollin | H01L 21/67109 |

* cited by examiner

FIG. 7A  FIG. 7B

SELECTIVE AND ISOTROPIC ETCH OF SILICON OVER SILICON-GERMANIUM ALLOYS AND DIELECTRICS; VIA NEW CHEMISTRY AND SURFACE MODIFICATION

RELATED APPLICATION

This application claims priority to provisional application No. 63/339,895 filed May 9, 2022, which is incorporated in its entirety by reference.

TECHNICAL FIELD

This disclosure relates generally to semiconductor fabrication, and in certain embodiments, to plasma etching techniques.

BACKGROUND

The integrated circuit (IC) manufacturing industry strives to increase device density to improve speed, performance, and costs. For continued scaling to smaller node sizes, device architectures have evolved from two-dimensional (2D) planar structures to three-dimensional (3D) vertical structures, such as with nanowires or vertically oriented transistors. Insufficient control of the conducting channel by the gate potential drives a desire for this change. Short channel effects (SCE) may become too significant as gate dimensions are scaled down and may increase current conduction when no voltage is applied to the gate (Ica). A change in device architecture may allow better electrostatic control of the gate to reduce the SCE and power loss. Fabricating nanowire devices may present 3D etch challenges where highly selective isotropic etch processes are beneficial. For example, layers of exposed materials may need to be etched relative to one another to create indents in a film stack, or other selective etches in a film stack.

SUMMARY

Some embodiments of the invention describe selective and isotropic etch of silicon relative to germanium-containing materials and dielectric materials. In certain embodiments, a method is described for processing a semiconductor substrate that includes receiving a semiconductor substrate that includes a film stack. The film stack includes first and second germanium (Ge)-containing layers and a first silicon (Si) layer positioned between the first and second Ge-containing layers. The method further includes removing an oxide layer, such as a native oxide layer, from the film stack and forming a termination layer on the first germanium-containing layer and the second germanium-containing layer by treating the film stack with a treatment gas comprising fluorine agents and oxygen agents, and heat-treating the film stack. The method further includes exposing the film stack to a plasma comprising fluorine agents and nitrogen agents, the plasma selectively etching the first silicon layer and converting the termination layer to an etch protection layer that inhibits etching of the first germanium-containing layer and the second germanium-containing layer during exposure of the film stack to the plasma. Apparatus providing the selective removal or etching and related processing are also disclosed.

BRIEF DESCRIPTION OF THE DRAWINGS

For a more complete understanding of this disclosure, and advantages thereof, reference is made to the following descriptions taken in conjunction with the accompanying drawings, in which.

DETAILED DESCRIPTION OF ILLUSTRATIVE EMBODIMENTS

Various techniques for attempting to selectively etch one material relative to another exist. In some cases, the chemistry of two materials is sufficiently distinct to allow a plasma that is selective to etching one of the materials to be used without concern for etching the other material. In other cases, determining appropriate etching regimes for selective etching is more difficult because the chemistry of the materials may be similar or the available etching processes may be limited by other factors. Certain materials present more difficult selectivity challenges where it is desirable to etch one material with little to no etching of another material. Conventional processes for this type of selective etching may be unable to achieve selective etching of one material relative to another or may fall short of process requirements such as selectivity, etch profile (e.g., local uniformity and/or surface roughness), and others.

Selectivity challenges may arise in forming nanowires or nanosheets to act as a channel region in a 3D vertical structure of a semiconductor device, such as a gate-all-around (GAA) device. Forming such nanowires may involve forming a film stack on a base layer, the film stack including layers of Si and Ge or Si—Ge(SiGe) alloy arranged in an alternating stack. Part of this process may include, for example, etching indents in the film stack at opposing ends of the Si layers, while minimizing etching of the Ge-containing layers, to expose end portions of the Ge-containing layers for later use as a conducting device. Due to various challenges, including in part a native oxide layer (NOL) and/or other residues (e.g., reactive ion etching (RIE) residue) present on surfaces of the film stack, conventional etching techniques may be unsatisfactory.

For example, some conventional techniques employ a single etch step using a plasma of nitrogen trifluoride ($NF_3$) (or another etchant) and oxygen ($O_2$). Fluorine radicals in this plasma may etch the Si layers, while the oxygen may react with the Ge in the Ge-containing layers to form a Ge oxide (e.g., $GeO_2$) protection layer on the Ge-containing layers. Post-etch, however, resulting structures generally show unacceptable levels of surface roughness along exposed surfaces of the Si layers and the Ge-containing layers, resulting in part from the etching of the NOL. Furthermore, although the GeO$_2$ protection layer may facilitate selectively etching the Si layers, the GeO$_2$ layer consumes a significant portion of the Ge-containing layers.

Embodiments provided below describe various methods of selective etching. For example, embodiments may be used to selectively etch portions of a film stack (e.g., that includes Si layers and Ge-containing layers in an alternating stacked arrangement) of a substrate. For example, it may be desirable to selectively etch indents in edge portions of (or possibly completely remove) the Si layers to form nanowires of the Ge-containing layers. Further, embodiments of the invention reduce plasma damage during the selective Si etching.

FIGS. 1A-1E illustrate cross-sectional views of an example substrate 102 during an example process 100 for processing substrate 102, according to certain embodiments of this disclosure. In certain embodiments, process 100 incorporates an oxygen-free plasma etch process to etch portions of certain layers of a film stack of substrate 102, resulting in substrate 102 having an indented film stack following execution of process 100. It should be understood that oxygen-free does not necessarily mean that all oxygen is eliminated from process 100, but instead reflects that oxygen-containing gas, such as O$_2$ and CO$_2$, is not deliberately introduced as part of the plasma etch process.

Figure 1A:
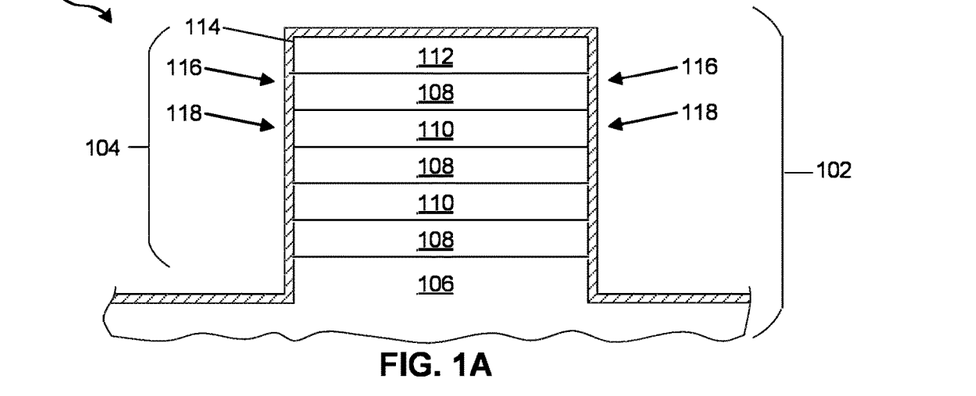
FIGS. 1A-1E illustrate cross-sectional views of an example semiconductor substrate during an example process for processing the semiconductor substrate, according to certain embodiments of this disclosure.

As illustrated in FIG. 1A, substrate 102 is a semiconductor substrate that includes film stack 104 disposed on a base layer 106. Film stack 104 includes Si layers 108 and Ge-containing layers 110 in an alternating stacked arrangement. Film stack 104 may have any suitable shape and include any suitable number of layers. As examples, the vertical thickness of Si layers 108 and Ge-containing layers 110 may be about 10 nm to about 25 nm each, and as particular examples may be about 10 nm or about 20 nm. Additionally, Si layers 108 may have the same thicknesses or may vary in thickness relative to one another, Ge-containing layers 110 may have the same thickness or may vary in thickness relative to one another, and Si layers 108 and Ge-containing layers 110 may have the same thicknesses or may vary in thickness relative to one another. In a particular example, Si layers 108 and Ge-containing layers 110 all have substantially the same thicknesses.

The material of Si layers 108 may be pure Si or Si nitride (SiN), for example. In certain embodiments, all Si layers 108 include the same material; however, Si layers 108 may include different materials if desired.

The material of Ge-containing layers 110 may be pure Ge or SiGe alloy, for example. As a particular example, the Ge-containing layers 110 may include a SiGe alloy (mixture) in an appropriate ratio (e.g., Si$_{0.7}$Ge$_{0.3}$, Si$_{0.75}$Ge$_{0.25}$, etc.) for desired etching properties of a given application or for desired performance in a resulting semiconductor device formed using, in part, process 100. In certain embodiments, all Ge-containing layers 110 include the same materials; however, Ge-containing layers 110 may include different materials if desired.

Base layer 106 may be any suitable material and includes Ge or SiGe alloy in one example. In a particular example, film stack 104 is formed by growing alternating heteroepitaxial layers of Si (e.g., Si layers 108) and Ge or SiGe (e.g., Ge-containing layers 110) atop base layer 106.

An optional hard mask 112 may be included on top of film stack 104. Hard mask 112 may have been used to form the structure of film stack 104, in a previous etch process for example. In certain embodiments, hard mask 112 is SiN but may include any suitable material.

A barrier layer 114 is formed over film stack 104 (including hard mask 112) and, in this example, base layer 106. Barrier layer 114 may result from prior fabrication steps (e.g., RIE) applied to substrate 102 or from other handling of substrate 102 (e.g., exposure to ambient air when transferring between processing tools). As particular examples, barrier layer 114 may include a native oxide layer (NOL), RIE residue, or both. A NOL may be a thin layer of SiO$_2$ (or other suitable material), about 1 nm to about 2.0 nm thick for example, that forms on surfaces of substrate 102, such as when substrate 102 is exposed to ambient air, which contains O$_2$ and H$_2$O. For example, surfaces of base layer 106, Si layers 108, Ge-containing layers 110, and hard mask 112 may interact with the ambient air, which may result in barrier layer 114 at those surfaces. As another example, surfaces of base layer 106, Si layers 108, Ge-containing layers 110, and hard mask 112 may include a residue resulting from prior RIE steps.

Barrier layer 114 may have different etch properties than layers that underlie barrier layer 114. Although shown as having generally uniform coverage over film stack 104 (including hard mask 112) and base layer 106, barrier layer 114 might or might not have uniform coverage.

Each of the layers in film stack 104 has a pair of exposed surfaces at opposed ends when viewed, as illustrated, from a cross-sectional perspective. That is, each of Si layers 108 has (opposing) exposed surfaces 116, and each of Ge-containing layers 110 has (opposing) exposed surfaces 118. Additionally, in the state illustrated in FIG. 1A, because substrate 102 includes barrier layer 114, exposed surfaces of 116 of Si layers 108 and exposed surfaces 118 of Ge-containing layers 110 include barrier layer 114.

Figure 1B:
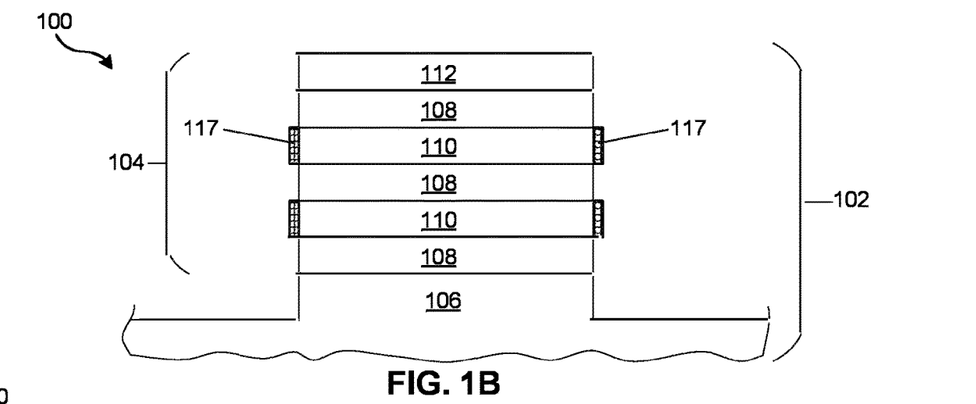

In FIG. 1B, in order to remove at least a portion of the barrier layer 114 containing a NOL, the film stack 104 is treated with a treatment gas containing in an example, fluorine agents and oxygen agents, and thereafter, the film stack 104 is heat-treated. This removes the barrier layer 114 from exposed surfaces 116 of Si layers 108 (or in regions 116 of layer 114 adjacent Si layers 108) and from exposed surfaces of base layer 106 and hard mask 112. Further, the exposure to the treatment gas reacts with the barrier layer 114 and forms a termination layer 117 or modified surface on exposed surfaces 118 of Ge-containing layers 110. According to one embodiment, the treating is performed in the absence of a plasma. In one example, the treating resulted in ~60% atomic % reduction of O at Ge-containing layers 110 (reduction in O of termination layer 117 compared to layer 114), where the loss of O was accompanied with an increase in Ge and F atomic %. In an example, the termination layer or modified surface 117 includes H, Si, F and Ge, which later reacts with a plasma (discussed below) to germanium nitride in the regions occupied by the layer or modified surface 117. Further, as a result of the gas treatment of the barrier layer 114, the modified barrier layer will have H, Si, F and Ge in the regions 118 and will not sublimate in the heat treatment, whereas the regions 116 of the barrier layer 114 (adjacent the Si containing layers) will sublimate in the heat treatment, and there is little or no nitriding in the regions adjacent or on side surfaces of the Si containing layers in the subsequent plasma step. Thus, the gas treatment and heat treatment provide a selective removal or selective sublimation of the layer portions of region 116 (adjacent or on the surface of Si containing layers).

Although the termination layer or modified surface 117 may have any suitable thickness, in certain embodiments, termination layer 117 is relatively thin, such as 2 nm or less. The termination layer could be, for example, a monolayer. In certain embodiments, termination layer 117 contains fluorine, such as Ge—F. In some examples, the treatment gas further comprises hydrogen agents. In some examples, the treatment gas comprises a fluorine-containing gas and a hydroxide containing gas (including, e.g., $H_2O$ and/or OH) and typically a carrier gas (e.g., Ar and/or N). In one example, the treatment gas comprises hydrogen fluoride (HF) gas and water ($H_2O$) gas (e.g., aerosolized water and/or water vapor). In some embodiments, the exposure to the treatment gas may be performed at a substrate temperature between about 0° C. and about 35° C. In certain embodiments, the heat-treating may be performed at a substrate temperature of about 100° C. to 250° C., preferably from about 150° C. to about 200° C. In one example, the heat-treating may be performed at sub-atmospheric pressure in the presence of an inert gas (e.g., $N_2$ and/or Ar). Preferably, the heat treatment is at a pressure of 1000 mTorr to 3000 mTorr, and a pressure in the range of 1800 mTorr to 2200 mTorr is particularly preferred.

Reference is made to a "gas phase" treatment herein to distinguish from a plasma phase, although certain components, for example, water could be in an aerosolized or vapor phase form. Accordingly, unless specified particularly, a gas phase can include a vapor or aerosolized component such as water.

In an example, a substrate as illustrated in FIG. 1A is subjected to a non-plasma treatment to treat the barrier layer 114 with treatment gases that include aerosolized $H_2O$, fluorine, and a carrier gas (e.g., N and/or Ar). The treatment gas will modify the layer 114 differently depending upon which layer (a Si containing layer or a Ge-containing layer) the barrier layer covers. In particular, in an example, in the portions 118 (covering Ge containing layers, 110), the modified layer will include H, Si, Ge and F, while in the regions 116 (covering Si containing layers 108), the modified portion of 116 of the barrier layer 114 will include H, Si and F, but will not include Ge (or, if any Ge is present, it is in amounts lower than that of region 118). In an example, the treatment is performed in a first chamber, and the next step, the heat treatment (resulting in the substrate as shown in FIG. 1B) is performed in a second chamber, although it is possible to perform multiple steps in the same chamber. After the treatment of the barrier layer 114 to form the regions 116, 118, in the heat treatment, residual water vapor is removed, and also remaining amounts of the layer portions 116 are also removed, so that the termination layer 117 or modified surface 117 on side surfaces of the germanium layer 110 are present, and this termination layer 117 or modified surface 117 preferably includes H, Si, Ge and F. The heat treatment is, for example, at 100° C. to 250° C., preferably 150° C. to 200° C., and in an inert atmosphere as noted above (e.g., N and/or Ar). The termination layer 117 or modified surface 117 is then converted to the protection layer 121 with a plasma as discussed further below.

Figure 1C:
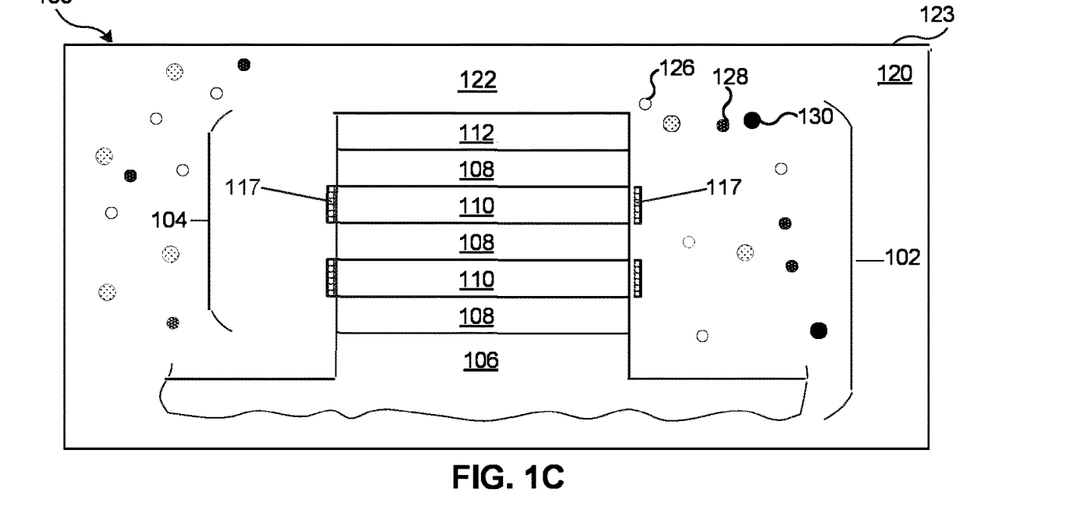

As shown in FIG. 1C, in a plasma step 120 of process 100, substrate 102 is exposed to a plasma for processing a semiconductor substrate. The plasma 122 selectively etches the silicon layers 108 and converts the termination layer 117 to form an etch protection layer 121 on the side surfaces 118 of the Ge-containing layers 110. For example, volatile etch-byproducts of Si etching can contain a fluorosilicate material and the etch protection layer 121 can contain Ge nitride. The plasma step 120 is performed at a substrate temperature that is below the sublimation temperature of the etch protection layer 121. In some embodiments, the plasma step 120 may be performed at a substrate temperature between about −50° C. to 25° C., and preferably in a range of −40° C. to about 20° C. Pressure during the plasma processing can be, for example, 25 mTorr to 700 mTorr, preferably 50 mTorr to 500 mTorr, and more preferably 150 mTorr to 400 mTorr. As discussed below, the plasma process can include two parts or two steps, including a first plasma which includes H and N but without F or another halogen introduced, and a second plasma which includes each of H, N and F (or another halogen) introduced into the plasma. The same pressures and temperatures have been advantageously used for each part, however, different temperatures and/or pressures could be used.

The nitride (e.g., Ge nitride) etch protection layer 121 may be insoluble in water, allowing the etch protection layer 121 to act as an $O_2$ and $H_2O$ diffusion barrier and thereby improve the stability of the nanowire formed from the Ge-containing layer 110. In addition to being selective to Ge and SiGe, plasma 122 (e.g., a fluorine-, hydrogen- and nitrogen-containing plasma) also may be selective to $SiO_2$, $Si_3N_4$, oxides, and low-k dielectric materials, as plasma 122 lacks the oxygen that causes conventional F/O-based plasmas to etch these materials.

In an example of the plasma treatment of FIG. 1C, there is an initial plasma treatment with a plasma which includes hydrogen and nitrogen, but preferably does not include fluorine (or another halogen) or oxygen, and thereafter, fluorine (or another halogen) is added to the plasma. During the initial plasma which does not include fluorine, the plasma which includes hydrogen and nitrogen reacts with the modified layer 117 to form a nitride to thereby provide the protection layer (illustrated at 121 in FIG. 1D). Thereafter, once the fluorine is introduced, the silicon containing layers 108 are etched. Continued supply of the H and N in the plasma prevents or reduces consumption of the layers 117/121, while the fluorine plasma etches the Si containing layer 108. If needed, after the exposure to the plasma which includes fluorine, the exposure to a plasma which does not include fluorine can also be repeated (e.g., for 5 seconds to 25 seconds, preferably 8 to 20 seconds, more preferably 10 to 15 seconds) without fluorine, and then fluorine can be introduced again to ensure the protection layer 121 is not etched completely while etching of the silicon-containing layer 108. As discussed below, the repeated exposure to a non-halogen plasma (which includes H and N) followed by a halogen plasma can also be used to provide a protection layer on newly exposed Ge (or SiGe) surfaces, which are exposed upon etching of the Si containing layer, for example as top and bottom surfaces of the Ge containing layer are exposed upon indenting of an Si containing layer.

In a preferred example, both for the plasma which does not include fluorine (e.g., a first plasma) as well as for the plasma, which includes fluorine (a second plasma), ions are removed from the plasma before exposing the substrate to the plasma, so that radicals of the plasma react with the substrate to form the protection layer 121 and etch the layer 108. For example, the plasma can be formed as a remote plasma in which the plasma is generated in a first chamber or first chamber portion, and the plasma is fed to a second chamber or second chamber portion (in which the substrate is positioned), while removing ions, for example, using a grid or mesh arrangement which is charged to remove ions. The chamber or chamber portion in which the substrate is positioned is not separately excited to form a plasma therein, but instead, receives plasma that has been generated in the first chamber or first chamber portion. Although it is preferred to remove ions or process only with radicals, advantageous results have also been observed in a presence of ions, and therefore, the plasma could also be struck in the same chamber (or chamber portion) in which the substrate is positioned.

As used herein, describing that fluorine (or another halogen) is not present means that fluorine (or another halogen) is not introduced, although trace amounts may be present depending upon the purity of the materials and/or as a result of gases released for example, from other materials or layers.

During the plasma exposure including each of H, F and N, preferably volumetric flow rate ratios of F:N is, for example, in a range of 1:5 to 1:10, preferably in a range of 1:5.5 to 1:9, and preferably about 1:7. If excessive nitrogen is introduced, formation of nitrides or formation of the protection layer can creep into the regions of the Si containing layer and inhibit etching of the Si containing layer. In an example, the ratio of the volumetric flow rates of fluorine and hydrogen (F:H) can be in a range from 1:1.5 to 1:2.5, preferably about 1:2. When fluorine is not introduced, the ratio of N:H can be, for example, in a range from 4.5:1 to 3.5:1, for example 4:1. In an example, RF power can be used for plasma formation (both plasmas or both parts of the plasma processing), e.g., at 200 to 500 watts, preferably 250 to 350 watts.

In certain embodiments, plasma step 120 is an isotropic etch process. Plasma step 120 may be performed in a plasma chamber of a plasma tool. The plasma tool may be any suitable type of plasma tool, including an inductively-coupled plasma (ICP) tool, a capacitively-coupled plasma (CCP) tool, a surface wave plasma (SWP) tool, and others. One example plasma tool is described below with reference to FIG. 3.

For example, substrate 102 may be exposed to plasma 122, which is an oxygen-free plasma. It should be understood that oxygen-free does not necessarily mean that all oxygen is eliminated from plasma step 120, but instead reflects that oxygen-containing gas is not deliberately introduced as part of plasma step 120. Removing all oxygen from a plasma chamber 123 may be difficult or impossible, so some oxygen may still be present during certain steps described below.

Plasma 122 may include fluorine agents 126, hydrogen agents 128, and nitrogen agents 130. Fluorine agents 126 may act primarily as the etchant for forming etch-byproducts at exposed surfaces 116 of Si layers 108. Hydrogen agents 128 may act as a reducing agent in the presence of fluorine agents 126. Furthermore, if applicable depending on the gases used to generate plasma 122, hydrogen agents 128 may further break down certain compounds of fluorine and nitrogen to produce fluorine agents 126 and nitrogen agents 130. Nitrogen agents 130 react with the Ge in the termination layer 117 from exposed surfaces 118 (which includes H, Si, Ge and F) of Ge-containing layers 110 to form a nitride layer (e.g., a Ge nitride layer, such as $Ge_3N_4$) at exposed surfaces 118. For example, the atomic nitrogen (N) generated in plasma 122 may react with the Ge at exposed surfaces 118 of Ge-containing layers 110 to form the etch protection layer 121.

In certain embodiments, plasma 122 may be generated from gases that include fluorine gas, nitrogen gas, and hydrogen gas. As a few examples, a fluorine-containing gas that is used to generate plasma 122 for the second portion of the plasma processing may include $F_2$, $NF_3$, sulfur hexafluoride ($SF_6$), or carbon tetrafluoride ($CF_4$). Furthermore, although fluorine is described, other halogens may be used to facilitate the etching process.

In certain embodiment, no oxygen-containing gas is deliberately introduced as part of the gases from which plasma 122 is generated. As a particular example, the gases used to generate plasma 122 may include a suitable combination of $NF_3$, $N_2$, and $H_2$. As another particular example, the gases may include $NF_3$, ammonia ($NH_3$), and $N_2$. In certain embodiments, the $N_2$ could be replaced by a noble gas, such as argon (Ar) or krypton (Kr), or such a noble gas may be used in combination with $N_2$. As particular examples, gases/gas combinations used to generate plasma 122 may include $N_2/H_2/NF_3$, $N_2/NH_3/NF_3$, $Ar/NH_3/NF_3$, $N_2/H_2/Ar/NF_3$, $NF_3/NH_3$, $NF_3/H_2$, or $N_2/H_2/NH_3/NF_3$.

In an example in which the gases used to generate plasma 122 include $NF_3$ and $N_2$, the ratio of $NF_3$ to $N_2$ may be an appropriate consideration. In certain embodiments, plasma 122 includes more nitrogen than fluorine to ensure that the etch protection layer 121 is formed sufficiently quickly to reduce or eliminate etching of Ge-containing layers 110 by the fluorine and because the fluorine is the more reactive chemistry in plasma 122. The appropriate ratio (or range of ratios) may depend on a variety of factors, including other process parameters and the concentration of Ge in Ge-containing layers 110. In certain embodiments, higher percentages of Ge in Ge-containing layers 110 may result in a more-quickly formed etch protection layer 121 and lead to better results. $H_2$ may be added to help drive the reactions occurring in plasma chamber 123. Example ranges for the ratio of $NF_3$ to $H_2$ may include from $NF_3:H_2=1:0.5$ to $NF_3:H_2=1:10$. Example ranges for the ratio of $NF_3$ to $N_2$ may include from $NF_3:N_2=1:1$ to $NF_3:N_2=1:15$.

Other process parameters for generating plasma 122 include gas flow rates, pressure, plasma source power, plasma bias power, time, and temperature. The gases for forming plasma 122 may be provided at any suitable flow rate. In certain embodiments, the etchant source gas flow rate is $NF_3=20$-50 sccm, $H_2=30$-150 sccm, $N_2=50$-500 sccm. In certain embodiments, plasma step 120 may be performed at intermediate pressure (e.g., about 50 mTorr to about 500 mTorr, and in one example about 300 mTorr to about 350 mTorr) and at intermediate source power (e.g., about 150 W to about 800 W, and in one example about 200 W to about 300 W). Exposure time for plasma step 120 may be any suitable time. In certain embodiments, exposure time could be as little as about five seconds or less, ten seconds or less, fifteen seconds or less, or twenty seconds or less. In a particular embodiment, exposure time is about fifteen seconds. In certain embodiments, plasma step 120 is performed at a temperature of approximately −40° C. to approximately 20° C., and in one example at about 0° C. Preferably, the temperature is in a range of −50° C. to 25° C. It should be understood that particular values and ranges provided herein are for example purposes only.

One example recipe for the oxygen-free etch process 120 includes the following: pressure 350 mTorr; source power (inductively coupled plasma) 300 W; bias power 0W; wafer processing temperature 0° C.; and $NF_3$, $H_2$, and $N_2$ flow rates of 30 sccm, 55 sccm, and 250 sccm, respectively. Another example recipe may include: pressure 300 mTorr; source power (inductively coupled plasma) 300 W; bias power 0W; wafer processing temperature 0° C.; and $NF_3$, $H_2$, and $N_2$ flow rates of 20 sccm, 36 sccm, and 250 sccm, respectively. Another example recipe may include: pressure 50 mTorr; source power 150 W; wafer processing temp −40 C; and flows of 30 sccm, 15 sccm, and 450 sccm for $NF_3$, $H_2$, and $N_2$, respectively.

Figure 1D:
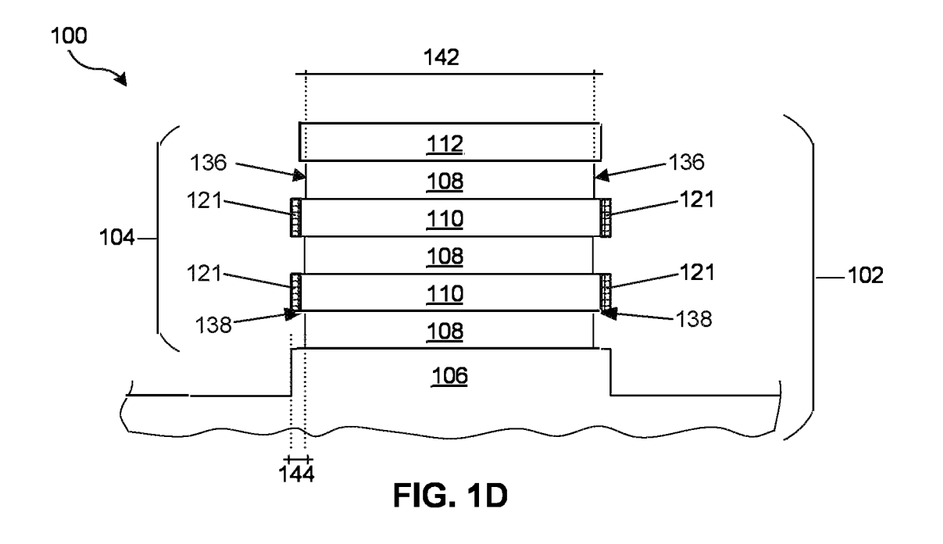

FIG. 1D further shows certain measurements of resulting substrate 102, such as exposed end separation 142 and etched width 144. The desorption of the etch-byproducts from the Si layers 108 forms indents 136 and additional surfaces 138 of Ge-containing layers 110. For example, exposed end separation 142 shows the remaining width (per this cross-section) of Si layers 108 by measuring each Si layer 108 from a first exposed surface 116 on a first side of film stack 104 to an opposing second exposed surface 116 on a second side of film stack 104. Exposed end separation 142 may be less than 20 nm in certain embodiments, and between 2 nm and 20 nm in one embodiment. The exposed end separation may also refer to the separation of exposed ends prior to etching. Etched width 144 may measure how much of a particular Si layer 108 was removed from a particular end of the particular Si layer 108. In other words, etched width 144 may measure the amount of an indent 136 of a Si layer 108. In certain embodiments, etched width 144 is about 5 nm to about 15 nm. However, exposed end separation 142 and etched width 144 may be outside these ranges depending on a given application.

Figure 1E:
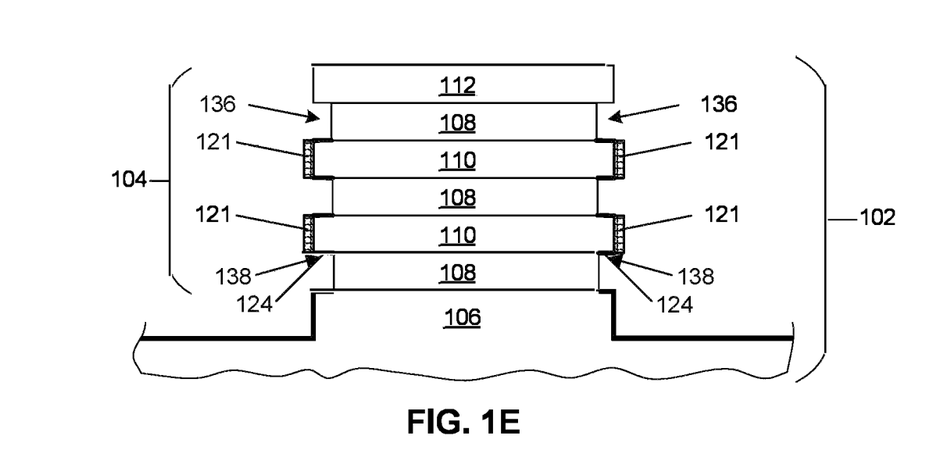

As illustrated in FIG. 1E, the Si layer 108 is further etched by a longer exposure to the plasma 122 which increases the etched width 144. Further, the atomic nitrogen (N) generated in plasma 122 may react with the Ge at to form a passivation layer 124 (e.g., a nitride layer) on additional surfaces 138 of Ge-containing layer 110 and surfaces of base layer 106.

In certain embodiments, plasma step 120 may utilize pulsing of the plasma to increase the etch selectivity and minimize plasma damage to the Ge-containing layers 110. As an alternative, cycling of different plasmas or parts of the plasmas processing can be used. For example, a first plasma exposure can include nitrogen agents but no fluorine agents, and second plasma exposure can include both fluorine agents and nitrogen agents. The first and second plasma exposures (for first and second time periods) may be sequentially repeated to further etch the Si layers 108 (for third and fourth time periods). In one example, the first plasma exposure can include N2 and H2 for 5 seconds-30 seconds (preferably 8 to 25 seconds, more preferably 10 to 15 seconds), and the second plasma exposure can include NF3, N2 and H2 for 5 seconds-30 seconds (preferably 8 seconds to 25 seconds). The use of the first plasma exposure, which does not contain fluorine agents (or another halogen), further aids in forming the passivation layer 124 (e.g., a nitride layer) on additional surfaces 138 of Ge-containing layer 110 and surfaces of base layer 106. Thus, the substrate (the stack) can be exposed to the first plasma for a predetermined time (e.g., as controlled by the controller), and thereafter, exposed to the second plasma. The first plasma need not be extinguished in transitioning to the second plasma. For example, the first plasma can be formed with nitrogen and hydrogen containing gases and without fluorine. Once the predetermined time has elapsed, the nitrogen and hydrogen containing gases continue to be introduced, and a fluorine containing gas is also introduced to form the second plasma continuously after the first plasma.

As indicated in FIG. 1D, after the Si has been indented, upper and lower surfaces of the Ge containing layer (facing the indentations) are newly exposed and if etching with the fluorine (or halogen) containing gas plasma proceeds, the etching can etch into the Ge containing layers at the newly exposed surfaces. In an example, after the etching with fluorine or a halogen introduced has proceeded, for example, for 5 seconds-30 seconds, preferably for 8 seconds to 25 seconds (e.g.) in a second period of time after the initial first plasma for a first period of time, the flow of the fluorine (or halogen) containing gas is discontinued while supply of hydrogen and nitrogen containing gases continues for a third period of time, for example, for 8 seconds to 20 seconds, preferably, e.g., for 10 seconds to 15 seconds, and then introduction of the fluorine or halogen containing gas resumes for a fourth period of time (e.g., 5 seconds-30 seconds, preferably 8 seconds-25 seconds). As an alternative, after etching with fluorine or a halogen, the plasma power can be discontinued for a predetermined amount of time or both power and introduction of the fluorine (or halogen) containing gas can be discontinued for a predetermined amount of time (in a third period of time e.g., 8 seconds to 20 seconds or 10 seconds to 15 seconds), while introduction of hydrogen and nitrogen continues, followed by resumption of etching with the fluorine or halogen containing gas and plasma power application (in a fourth period of time). The cycling can similarly be repeated for additional time periods. The discontinuing of plasma power and/or discontinuing introduction of the halogen or fluorine could also occur after a predetermined etching amount (e.g., after each etching of 2 nm to 5 nm) or based on etching time (e.g., 8 seconds to 25 seconds, e.g., 8 seconds to 15 seconds). As a result, additional protection or passivation layers can be formed on newly exposed surfaces.

As noted earlier, in some embodiments, the plasma step 120 may use a remote plasma that results in a high concentration of radicals that impinge on the substrate 102. This reduces plasma damage to the film stack 104, including preserving the protection layer 121 and the profile of the Ge-containing layers 110 during the etching. For example, plasma can be formed in one chamber or chamber portion, and ions can be removed to form a plasma to which the substrate is exposed.

According to one embodiment, the sequential steps of exposing the film stack 104 to the treatment gas, heat-treating the film stack 104, exposing to the plasma which includes nitrogen but not fluorine, and exposing the film stack to the plasma comprising fluorine agents and nitrogen agents, may be repeated at least once to further selectively etch the Si layer 108.

Subsequent processing may then be performed on substrate 102. For example, plasma step 120 may be integrated into a process for forming Ge-containing layers 110 into respective nanowires for a channel region of a semiconductor device, such as a GAA device. In such a device, subsequent processing may include filling the indents 136 with an insulator or spacer, removing remaining portions of Si layers 108, providing a gate oxide around Ge-containing layers 110, and other associated steps, all of which are provided for example purposes only. In such a device, exposed ends 118 of Ge-containing layers 110 may serve as conductive contacts to a channel region formed in the area of film stack 104.

Figure 2:
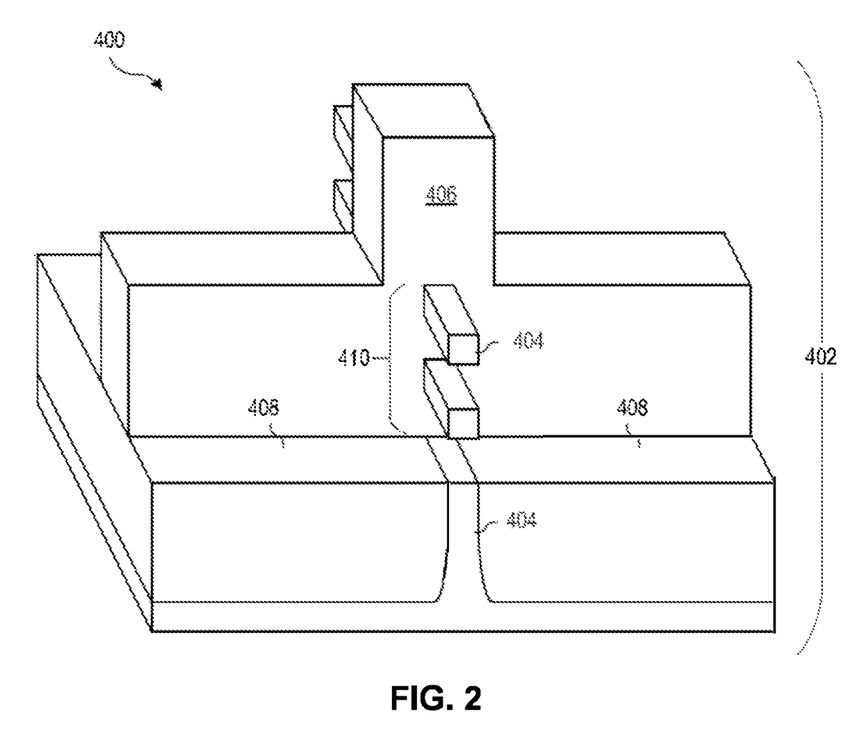
FIG. 2 illustrates an example device including a substrate with a recessed alternating film stack, according to certain embodiments of this disclosure.

FIG. 2 illustrates an example device 400 including a substrate with a recessed alternating film stack according to certain embodiments of this disclosure. At least a portion of device 400 may be formed using any of the processes and methods as described herein.

Device 400 includes a substrate 402 that includes a channel material 404 (e.g., Ge or SiGe) and a gate material 406, (e.g. SiGe or Si). Channel material 404 may correspond to Ge-containing layers 110 of substrate 102, at some point after process 100. Device 400 may be a GAA device as shown here or may be any other device, such as a fin field-effect transistor (FinFET). Device 400 also may include isolation regions 408. In certain embodiments, isolation regions 408 are shallow trench isolations (STIs).

Device 400 may be fabricated by first forming a recessed alternating film stack 410 (which may correspond to film stack 104 following process 100, possibly with additional subsequent processes) and then depositing additional gate material 406 over recessed alternating film stack 410. Specifically, device 400 may be formed by heteroepitaxial growth of alternating Si and Ge or SiGe layers which are then patterned and recessed vertically to expose the Ge or SiGe layers laterally.

The application of embodiments described herein may advantageously be an optimal solution for the 5 nm node, 3 nm node, or lower. For example, the GAA device architecture may be suitable for scaling beyond the 7 nm node. The GAA device architecture may address short channel effects found in some FinFET architectures by wrapping the gate around the entire channel instead of only three sides. This could reduce or eliminate current leakage occurring under the gate of the FinFET, therefore reducing non-active power losses.

According to one embodiment, the method for processing a semiconductor substrate, including selective Si etching, may be performed in a vacuum processing tool containing a treatment tool, a plasma tool, and a heat-treating tool. The vacuum processing tool may be configured for processing a substrate without exposing the substrate to air. For example, the gas treatment, heat treatment and plasma processing can be in different chambers of a multi-chamber system. According to one embodiment, the substrate processing can include treating the substrate with a treatment gas comprising fluorine agents and oxygen agents (e.g., $H_2O$) in a treatment tool, transferring the substrate under reduced pressure to a heat-treatment tool, heat-treating the substrate in the heat-treatment tool, transferring the substrate under reduced pressure from the heat-treatment tool to a plasma processing tool, and then exposing the substrate to a plasma comprising fluorine agents and nitrogen agents in the plasma processing tool. In one example, the treatment tool may also be used as a heat-treating tool.

According to some embodiments, the method for processing a semiconductor substrate can further include one or more post-etch treatments that may be performed after the plasma step 120 of process 100 in order to fully remove any fluorine from the film stack 104. A first post-etch treatment can include a heat-treatment as described above following the treatment step, for example using a substrate temperature of about 150° C. to about 200° C. The first post-etch treatment is effective in removing any lingering fluorine or residues on the film stack 104. A second post-etch treatment can include a treatment with a treatment gas containing fluorine agents and oxygen agents, as described above in FIG. 1B. The second post-etch treatment is effective in removing any oxidized fluorine residues on the Si layers 108. Thereafter, third post-etch treatment can include a heat-treatment as described above, for example using a substrate temperature of about 150° C. to about 200° C. The third post-etch treatment is effective in removing any remaining fluorine or residues on the film stack 104.

Figure 3:
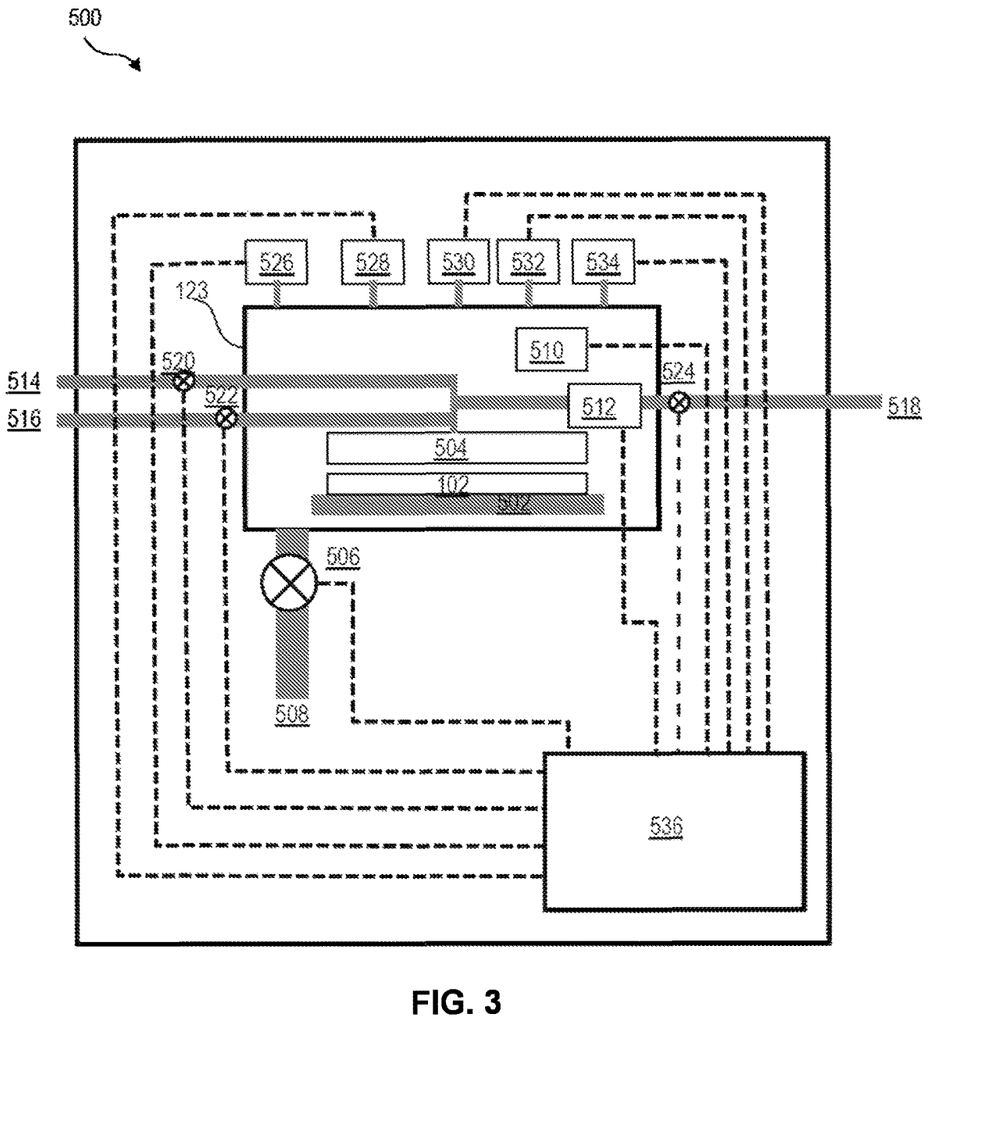
FIG. 3 illustrates a block diagram of an example plasma tool, according to certain embodiments of this disclosure.

FIG. 3 illustrates a block diagram of an example plasma tool 500, according to certain embodiments of this disclosure. Although a particular plasma tool 500 is illustrated and described, any suitable type of plasma tool may be used. Plasma tool 500 may be used to execute plasma process 120 described with respect to FIGS. 1A-1E.

Plasma tool 500 includes plasma chamber 123 in which a semiconductor substrate (e.g., substrate 102) is processed using a plasma (e.g., plasma 122). Plasma chamber 123 includes a substrate table 502 configured to support substrate 102 during processing. In certain embodiments, substrate 102 is positioned on substrate table 502 in the condition shown in FIG. 1B, following the treatment step for example, for performing plasma step 120 using plasma 122. The material of Si layers 108 (described above, for example, with reference to FIGS. 1A-1E) of film stack 104 of substrate 102 is selectively etched within plasma chamber 123 by injecting the plasma (e.g., plasma 122) through a shower head 504 of plasma tool 500. Shower head 504 may include a single mixed reaction cavity that is filled with the etch gases, mixing gases, and carrier gases that mix to form plasma 122 and a set of exit holes for dispensing plasma 122 toward substrate 102. The plasma can be formed in a chamber upstream from the showerhead 504, which can be considered as a chamber or chamber portion separate from the chamber or chamber portion in which the substrate is positioned, or alternately, separate chambers or chamber portions can be separated by a grid or mesh arrangement in which the plasma is generated in a first chamber or chamber portion having the process gases fed thereto and excited in the first chamber or chamber portion, and as the plasma passes to the chamber or chamber portion in which the substrate is positioned, ions are extracted, so that the substrate is processed with the plasma after ions have been removed, so that radicals of the plasma react with the substrate.

Plasma chamber 123 includes and/or is otherwise coupled to a vacuum pump 506 coupled to a vacuum line 508 to purge residual precursor gases from plasma chamber 123 and also may include and/or otherwise be coupled to a pressure system to maintain a target pressure in certain embodiments. Plasma chamber 123 may further include machine tools or components such as a heater 510 and temperature sensor 512 used to heat substrate 102 and control the temperature within plasma chamber 123 and/or of substrate 102.

Plasma tool 500 includes a precursor gas line 514, a mixture gas line 516, and a carrier gas line 518 coupled to shower head 504, for example. In certain embodiments, the etch gas fed through precursor gas line 514 may include a fluorine-based precursor, such as fluorine or $NF_3$, the mixture gas fed through mixture gas line 516 may include hydrogen, and the carrier gas fed through carrier gas line 518 may include nitrogen or an inert gas such as argon or krypton.

In certain embodiments, plasma tool 500 may include a system of mass flow controllers and sensors for control of gas flow (e.g., mass flow rate). Accordingly, plasma tool 500 may include a first flow controller 520, a second flow controller 522, a third flow controller 524, vacuum pump 506, heater 510, temperature sensor 512, voltage-current (V-I) sensor 526, and substrate sensors 528, 530, 532, and 534 (528-534). Precursor gas line 514, mixture gas line 516, and carrier gas line 518 are coupled to and controlled by first flow controller 520, second flow controller 522, and third flow controller 524, respectively.

Plasma tool 500 may include a controller 536 to control aspects of plasma step 120. Controller 536 may be implemented in any suitable manner. For example, controller 536 may be a computer or processor. As another example, controller 536 may include one or more programmable ICs programmed to provide functionality described herein. In a particular example, one or more processors (e.g., microprocessor, microcontroller, central processing unit, etc.), programmable logic devices (e.g., complex programmable logic device), field programmable gate array, etc.), and/or other programmable ICs are programmed with software or other programming instructions to implement functionality described herein for controller 536. The software or other programming instructions can be stored in one or more non-transitory computer-readable mediums (e.g., memory storage devices, flash memory, dynamic random access memory, reprogrammable storage devices, hard drives, floppy disks, DVDs, CD-ROMs, etc.), and the software or other programming instructions when executed by the programmable ICs cause the programmable ICs to perform operations described herein.

Machine components such as heater 510 and temperature sensor 512 of plasma chamber 123 as well as flow controllers 520, 522, and 524, vacuum pump 506, and other components external to plasma chamber 123 are coupled to and controlled by controller 536.

Equipment sensors measure equipment parameters such as the temperature of substrate table 502, heater currents, vacuum pump speed and temperature, and provide signals to ensure the equipment is operating properly. Various process sensors measure process parameters such as process temperature, process pressure, plasma density, gas flow rates, and gas composition, and provide signals to ensure the process is operating properly. The data from the equipment and process sensors provide feedback to controller 536 continuously throughout plasma step 120. Controller 536 can make adjustments in real time to keep the equipment and process close to center of specifications.

Controller 536 receives data from the sensor(s) and controls process parameters of plasma chamber 123 based on the sensor data. Controller 536 may analyze the data collected by the sensor(s), determine when to modify or end one or more steps of plasma step 120, and provide feedback to control process parameters of components of plasma chamber 123.

Controller 536 may be connected to V-I sensor 526, and substrate sensors 528-534 to monitor plasma 122 as substrate 102 is exposed to plasma 122 to provide conditions of plasma 122 as well as optionally composition and thickness data in real time. This feedback data can be used by controller 536 to continuously or periodically adjust plasma step 120 as substrate 102 is selectively etched using plasma 122 and, for example, to turn off plasma step 120 when the target indent (e.g., etched width 144) is reached (or when surfaces have been newly exposed as a result of an indent as discussed earlier). The control can be based upon detected conditions (or an accumulation of detected conditions), as well as time-based conditions, for example. For example, as discussed earlier, after the substrate has been modified with the non-plasma treatment, and subjected to a heat treatment, in a first plasma processing step, the substrate is exposed to a plasma which includes nitrogen and hydrogen, but not fluorine for a predetermined amount of time, for example, 5 seconds to 20 seconds, preferably at least 8 seconds, with a preferred amount of time, for example, 10 seconds to 15 seconds. After the predetermined amount of time has elapsed, fluorine is then introduced into the plasma, so that the substrate is exposed to a plasma which includes nitrogen, hydrogen and fluorine.

Measurement data from substrate sensors 528-534, and temperature sensor 512 may be received by controller 536 while controller 536 generates control signals sent to first flow controller 520, second flow controller 522, third flow controller 524, vacuum pump 506, and heater 510. It is to be understood that the number of gas flows and flow controllers, and then number of sensors or other components can vary.

Controller 536 may receive measurement or metrology data from substrate sensors 528-534 taken at multiple points across substrate 102 to measure process uniformity and the thickness and composition of passivation layer 124 (formed from exposure of substrate 102 to plasma 122), exposed end separation 142, and/or the target indent (e.g., etch width 144) in situ and in real time. For example, multiple across substrate sensors in a multi-substrate plasma tool can be used to monitor and tune the thickness and composition of the etch protection layer 121 and the passivation layer 124 (formed from exposure of substrate 102 to plasma 122), exposed end separation 142, and/or the target indent (e.g., etch width 144) from the top to the bottom of the substrate 102. Multiple across substrate sensors in a single substrate plasma tool can be used to monitor and tune the thickness and composition of the etch protection layer 121 and the passivation layer 124, exposed end separation 142, and/or the target indent (e.g., etch width 144) from the center of the substrate 102 to the edge of the substrate 102.

Substrate sensors 528-534 may be coupled to and/or located within plasma chamber 123 for monitoring various parameters of substrate 102, plasma tool 500 and/or plasma step 120. Substrate sensors 528-534 may include various types of sensors including, but not limited to, optical sensors (such as cameras, lasers, light, reflectometer, spectrometers, ellipsometric, etc.), capacitive sensors, ultrasonic sensors, gas sensors, or other sensors that may monitor a condition of substrate 102, plasma 122, and/or plasma tool 500. In certain embodiments, one or more optical sensors may be used to measure in real time (during plasma step 120) the thickness and refractive index of the material at surfaces 118 of Ge-containing layers and surfaces of base layer 106 (e.g., where passivation layer 124 is being formed), exposed end separation 142, and/or an etched width 144a (or another suitable measurement). As another example, a spectrometer may be used to measure in real time (during plasma step 120) a film thickness of the material at surfaces 118 of Ge-containing layers and surfaces of base layer 106 (e.g., where passivation layer 124 is being formed), exposed end separation 142, and/or an etched width 144a (or another suitable measurement). In yet another embodiment, a residual gas analyzer (RGA) may be used to detect in real time (during plasma step 120) precursor breakdown for real-time chemical reaction completion detection.

Controller 536 may receive user-input process parameters, including, for example, etch rate, conformality, profile, and deposition rate (e.g., of passivation layer 124) based on standard plasma etch parameters such as chamber pressure, chamber temperature, RF source power, RF bias power, RF waveform (e.g., continuous wave RF, pulsed RF, square pulse, sawtooth pulse, and the like), etch time, and the composition and flow rates of various process and carrier gases. Advantageously, allowing a user to tune plasma 122 to meet a target local critical dimension uniformity (LCDU).

Based on data from substrate sensors 528-534 and the user inputted process parameters, controller 536 generates control signals to temperature sensor 512 and heater 510 to adjust the heat within plasma chamber 123. As heater 510 heats plasma chamber 123, controller 536 constantly or periodically monitors temperature sensor 512 to track the temperature of plasma chamber 123 to send control signals to heater 510 to maintain the temperature in plasma chamber 123.

In an example, once controller 536 determines, based on data provided by temperature sensor 512, that the target temperature of plasma chamber 123 has been reached, controller 536 generates control signals and data signals to activate first flow controller 520, second flow controller 522, and third flow controller 524 and provide, based on the user-input process parameters, target flow rates of the precursor gas to first flow controller 520, a target flow rate of the mixing gas to second flow controller 522, and a target flow rate of the carrier gas to third flow controller 524. Once controller 536 determines that the corresponding flow rates are established, controller 536 provides power to plasma chamber 123 to power plasma 122 through bias and source electrodes. Based on the measurements from V-I sensor 526, the power being supplied to the bias and source electrodes may be adjusted. First flow controller 520, second flow controller 522, and third flow controller 524 each may be a closed loop control system connected to a flow rate sensor and an adjustable proportional valve that allows each flow controller to constantly or periodically monitor and internally maintain the target flow rates of each gas via the flow rate sensor and the adjustable proportional valve.

In certain embodiments, once controller 536 determines, based on the user inputted data, that the etch process time has been met, controller 536 generates control signals to deactivate first flow controller 520, second flow controller 522, and third flow controller 524, which may be deactivated at the same or different times, as may be appropriate.

Controller 536 may use or analyze substrate sensor data to determine when to end plasma step 120. For example, controller 536 may receive data from a residual gas analyzer to detect an endpoint of plasma step 120. In another example, controller 536 may use spectroscopic ellipsometry to detect an average film thickness of passivation layer 124, exposed ends 141 of Ge-containing layers 110, and/or exposed end separation 142 during plasma step 120 and indicate changes during plasma step 120. In another example, controller 536 may use spectroscopic ellipsometry to detect the refractive index of the material at surfaces 118 of Ge-containing layers and surfaces of base layer 106 (e.g., where passivation layer 124 is being formed) during plasma step 120 and indicate film composition change during plasma step 120. Controller 536 may automatically end plasma step 120 when an exposed end separation 142 and/or an etched width 144a (or another suitable measurement) objective is achieved. In certain embodiments, controller 536 may automatically adjust one or more parameters such as the ratio of NF3 to H2 and/or the ratio of NF3 to N2, for example, during plasma step 120 to achieve the desired etch profile of film stack 104. Controller 536 and the data from substrate sensors 528-534 also may be used to achieve a desired semiconductor substrate throughput objective. Further, controller 536 and the data from substrate sensors 528-534 may be used to achieve a desired etch profile of film stack 104 and composition along with a desired semiconductor substrate throughput or alternatively target a combination.

As noted earlier, a controller as described herein can include, for example, a computer or a processor, and can include a memory which stores non-transient computer-readable data and/or instructions. It is to be understood that a controller can include single or multiple distributed controllers or sub-controllers, for example, with a master or higher level controller providing instructions to sub-controllers which control individual chambers or components of a chamber.

Figure 4:
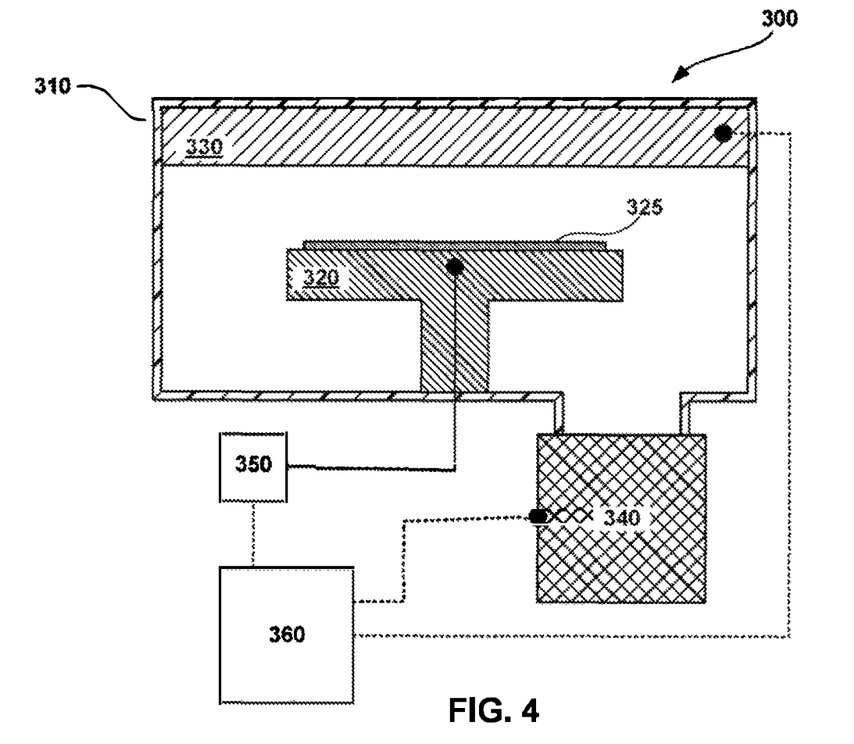
FIG. 4 provides a schematic illustration of a dry, non-plasma etching system according to an embodiment.

A system 300 for the heat-treating of a substrate is shown in FIG. 4. In one embodiment, the system 300 may also be used for the treatment step. Alternately, the initial non-plasma treatment of the barrier layer 114 (e.g., oxide layer such as $NO_2$) can be performed in one chamber, and the heat treatment in a separate chamber. The system 300 includes a process chamber 310 for processing workpiece 325 in a non-plasma, vacuum environment, a workpiece holder 320 arranged within the process chamber 310, and configured to support the workpiece 325, a temperature control system 350 coupled to the workpiece holder 320, and configured to control the temperature of the workpiece holder 320 at a setpoint temperature, a gas distribution system 330 coupled to the process chamber 310, and arranged to supply one or more process gases into the process chamber 310, and a controller 360 operably coupled to the temperature control system 350, and configured to control the temperature of the workpiece holder 320 ranging from −40° C. to 250° C., for example. For example, the temperature control system 350 can be configured to control the temperature of the workpiece holder 320. The process chamber 310 can include a vacuum pump 340 to evacuate process gases from process chamber 310. The process chamber 310 can further include a remote plasma generator or remote radical generator arranged to supply the process chamber with excited, radical or metastable species, or combinations thereof.

Gas distribution system 330 can include a showerhead gas injection system having a gas distribution assembly, and one or more gas distribution plates or conduits coupled to the gas distribution assembly and configured to form one or more gas distribution plenums or supply lines. Although not shown, the one or more gas distribution plenums may comprise one or more gas distribution baffle plates. Preferably, the gas supply can also supply an aerosolized $H_2O$ and/or water vapor for the initial non-plasma treatment (before the heat treatment). The one or more gas distribution plates further comprise one or more gas distribution orifices to distribute a process gas from the one or more gas distribution plenums to the process chamber 310. Additionally, one or more gas supply lines may be coupled to the one or more gas distribution plenums through, for example, the gas distribution assembly in order to supply a process gas comprising one or more gases. Process gases can be introduced together as a single flow, or independently as separate flows.

Gas distribution system 330 can further include a branching gas distribution network designed to reduce or minimize gas distribution volume. The branching network can remove plenums, or minimize the volume of gas plenums, and shorten the gas distribution length from gas valve to process chamber, while effectively distributing the process gas across the diameter of the workpiece 325. In doing so, gases can be switched more rapidly, and the composition of the chemical environment can be changed more effectively.

The volume of the process chamber 310 defining the chemical environment, to which the workpiece 325 is exposed, can be reduced or minimized in order to reduce or minimize the residence time or time required to evacuate, displace, and replace one chemical environment with another chemical environment. The time to displace the chemical environment in the process chamber 310 can be estimated as the ratio of the process chamber volume to the pumping speed delivered to the process chamber volume by the vacuum pump 340.

Workpiece holder 320 can provide several operational functions for thermally controlling and processing workpiece 325. The workpiece holder 320 includes one or more temperature control elements configured to adjust and/or elevate a temperature of the workpiece holder 320.

Figure 5:
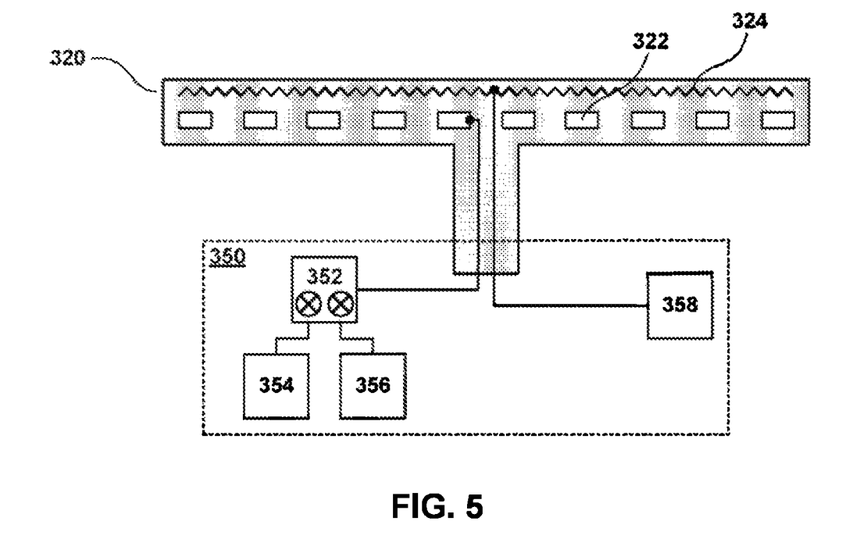
FIG. 5 provides a schematic illustration of a workpiece holder according to an embodiment.

As shown in FIG. 5, workpiece holder 320 can include at least one fluid channel 322 to allow flow of a heat transfer fluid there through and alter a temperature of the workpiece holder 320. Workpiece holder 320 can further include at least one resistive heating element 324. Multi-zone channels and/or heating elements can be used to adjust and control the spatial uniformity of heating and cooling of workpiece 325. For example, the at least one resistive heating element 324 can include a central-zone heating element and an edge-zone heating element. Additionally, for example, the at least one fluid channel 322 can include a central-zone fluid channel and an edge-zone fluid channel. At temperatures above 200 to 250° C., other heating systems can be used, including infrared (IR) heating, such as lamp heating, etc.

A power source 358 is coupled to the at least one resistive heating element 324 to supply electrical current. The power source 358 can include a direct current (DC) power source or an alternating current (AC) power source. Furthermore, the at least one resistive heating element 324 can be connected in series or connected in parallel.

The at least one resistive heating element 324 can, for example, include a resistive heater element fabricated from carbon, tungsten, nickel-chromium alloy, aluminum-iron alloy, aluminum nitride, etc. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe). According to one example, each of the at least one resistive heating element 324 can include a heating element, commercially available from Watlow Electric Manufacturing Company (12001 Lackland Road, St. Louis, Mo. 63146). Alternatively, or in addition, cooling elements can be employed in any of the embodiments.

A heat transfer fluid distribution manifold 352 is arranged to pump and monitor the flow of heat transfer fluid through the one or more fluid channels 322. The heat transfer fluid distribution manifold 352 can draw heat transfer fluid from a first heat transfer fluid supply bath 354 at a first heat transfer fluid temperature and/or a second heat transfer fluid supply bath 356 at a second heat transfer fluid temperature. Manifold 352 can mix heat transfer fluid from the first and second heat transfer fluid supply baths 354, 356 to achieve an intermediate temperature. Furthermore, the heat transfer fluid distribution manifold 352 can include a pump, a valve assembly, a heater, a cooler, and a fluid temperature sensor to controllably supply, distribute, and mix a heat transfer fluid at a predetermined temperature.

In an alternative embodiment, the temperature control system 350 can include a hot wall in close proximity to the work piece holder 320. The workpiece holder 320 can further include a workpiece clamping system configured to clamp the workpiece to the workpiece holder, and a backside gas supply system configured to supply a heat transfer gas to the backside of the workpiece.

The heat transfer fluid can include a high temperature fluid having a boiling point exceeding 200° C. For example, the heat transfer fluid can include Fluorinert™ FC40 (having a temperature range of −57 to 165° C.), or Fluorinert™ FC70 (having a temperature range of −25 to 215° C.), commercially available from 3M.

Workpiece holder 320 can be monitored using a temperature sensing device, such as a thermocouple (e.g. a K-type thermocouple, Pt sensor, etc.) or optical device. Furthermore, the substrate holder temperature control system 350 may utilize the temperature measurement as feedback to the workpiece holder 320 in order to control the temperature of workpiece holder 320. For example, at least one of a fluid flow rate, a fluid temperature, a heat transfer fluid type, a heat transfer fluid pressure, a clamping force, a resistive heater element current or voltage, a thermoelectric device current or polarity, etc. may be adjusted in order to affect a change in the temperature of workpiece holder 320 and/or the temperature of the workpiece 325.

As noted above, controller 360 is operably coupled to the temperature control system 350, and configured to control the temperature of various components in system 300, including the workpiece holder 320, at temperatures ranging from −40° C. to 250° C., for example. The temperature control system 350 can obtain temperature information from one or more temperature sensors arranged to measure the temperature of the workpiece holder 320, the workpiece 325, the chamber wall of the process chamber 310, or the temperature of the gas distribution system 330, among others, and utilize the temperature information to controllably adjust these temperatures.

Other chamber components of process chamber 310, including chamber walls, the gas distribution system 330, etc., can include heating and/or cooling elements to control the temperature thereof. For example, the chamber wall temperature of the process chamber 310 and the temperature of at least a portion of the gas distribution system can be controlled to a temperature up to 150° C., or within the range 50° C. to 150° C. (preferably, 70° C. to 110° C.).

Although described for a particular application of forming nanowires/nanosheets for GAA devices, this disclosure may be used in any type of isotropic etch of Si that is selective to Ge-containing layers. Furthermore, although the etch being performed is primarily described as being for forming indents in film stack 104 by removing portions of opposing ends of Si layers 108, processes 100 may be used to remove substantially all portions of Si layers 108, which may be referred to as releasing Ge-containing layers 110 or a channel release.

Figure 6:
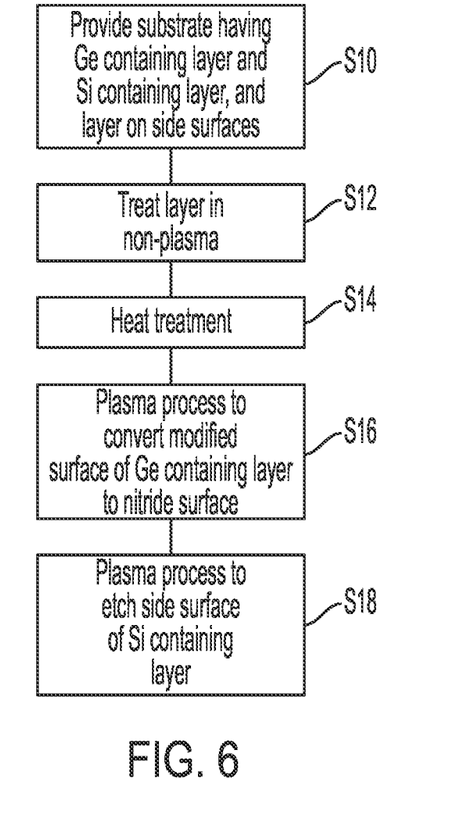
FIG. 6 is a flowchart or algorithm of an example of a process or operation of an apparatus.

Referring now to FIG. 6, an overview of an example of a process as disclosed herein is provided. The flowchart of FIG. 6 can provide, for example, an algorithm for control by one or more controllers of process chambers or systems disclosed herein.

As indicated that S10, a substrate is initially provided having a Ge containing layer and a Si containing layer, and also a layer on side surfaces of the stack, for example, an oxide layer as indicated at 114 of FIG. 1A.

As indicated at S12, a treatment is then performed, in a non-plasma environment in an example disclosed herein. In a preferred example, the non-plasma environment includes, for example, a hydrogen containing gas, an oxygen containing gas and a fluorine containing gas, with aerosolized water or water vapor provided in an example to provide H and 0, and HF or F for example to provide fluorine. The initial treatment in a non-plasma environment will treat the layer 114 to form a modified layer, for example, with modified portions 118 formed on the Ge containing layers, and which include H, Si, Ge, and F, with modified portions 116 formed on the Si containing layers and which include, for example, H, Si, and F, but without Ge or, at a minimum, less Ge than the portions 118.

A heat treatment is then performed as indicated at S14, which will remove remaining portions of the modified layer portions 116, and the heat treatment will also remove residual water vapor, with some reduction in fluorine. As a result, after the heat treatment, a termination layer 117 or modified side surface 117 remains as indicated in FIG. 1B while the portion previously located at 116 are removed.

As indicated at S16, S18, a plasma process is then performed upon the substrate, preferably including a first part S16 or first plasma step S16, followed by a second part S18 or second plasma step S18. In the first, a plasma is formed which includes nitrogen and hydrogen, but not fluorine or another halogen, so that the termination layer or modified surface 117 is converted into a protection layer including germanium nitride. Fluorine is then added to the plasma to perform an etch in S18, while nitrogen continues be supplied, to prevent consumption of the protection layer 121 and/or form additional protection on the Ge containing layer. Preferably, hydrogen is introduced in the plasma for both parts S16, S18 of the plasma processing. Also, preferably no oxygen is introduced in S16, S18.

The process can be repeated depending upon the amount of etching needed, and also, additional modified surfaces can be provided as represented at 124, 138 discussed earlier, so that additional exposed surfaces of the Ge containing layer are protected as they become exposed upon removal of the Si containing layer, for example, to form an indent.

Figure 7A:
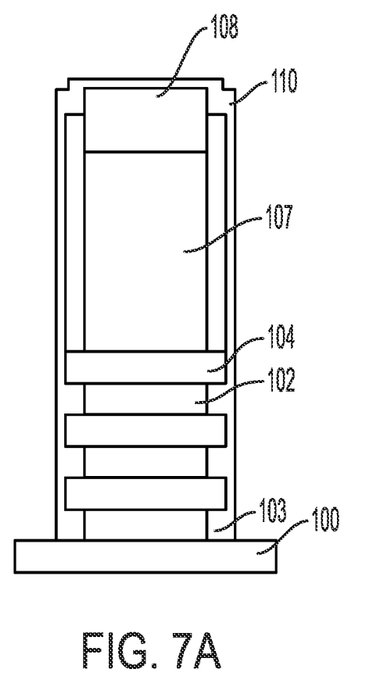
FIGS. 7A and 7B illustrate inner spacer deposition and etch back to leave an indented space inside an indentation.
Figure 7B:
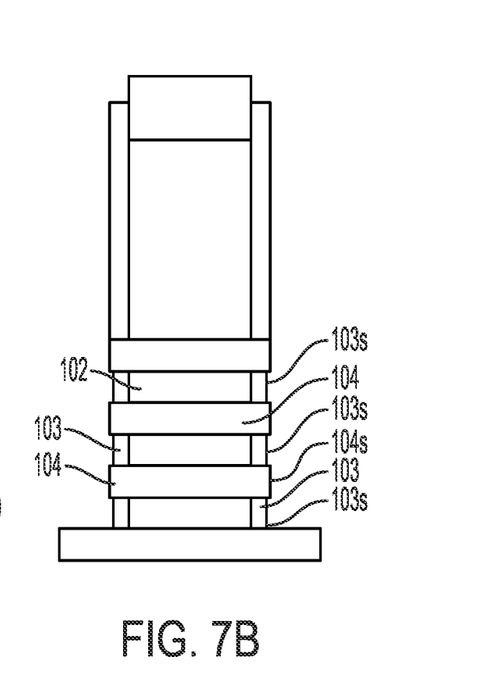

FIGS. 7A and 7B illustrate additional processing which can occur, for example, after the indent has been formed as illustrated in FIG. 1E described earlier.

The arrangement of FIGS. 7A and 7B include, for example, Ge containing layers 104, with Si containing layers 102 between the layers 104, with the Si containing layers having been indented as described earlier. The region 108 can be a mask, for example, a hard mask, and the region 107 can initially include a dummy gate, which is later removed and a gate metal deposited. After the indent process discussed earlier, a spacer layer 110 is deposited to provide an inner spacer layer 110. The layer 110 can be formed, for example, of a spacer material such as SiN or a low-k dielectric. The inner spacer layer 110 is then partially removed, so that spacers 103 are left in what previously was formed as the indents or indentations discussed earlier. The layers 102 can then be removed (channel release) so that channels 104 are left formed of the Ge containing layer, and the regions previously occupied by the dummy gate 107 and the Si containing layers 102 can then be filled with a gate metal. In addition, in removing or etching of the inner spacer layer 110 to leave the spacers 103, the spacers 103 should be indented with respect to the outer surface of the Ge containing layer or channel 104, so that an outer surface of the spacer 103$s$ has an outer dimension which is smaller than the outer surface or outer dimension 104$s$ of the layer 104. Although the present invention was discussed earlier with respect to etching of the Si containing layer (108 in FIGS. 1A-1B, 102 in FIGS. 7A and 7B), the invention could also be utilized, for example, for a channel release, in removing layer 102 (FIGS. 7A and 7B) while protecting the Ge containing layer 104 (for example, a SiGe layer). As another alternative, the invention could be applied to etch the spacer material 103 selective to or with respect to layer 104 (while protecting layer 104), so that the remaining portions of the inner spacer layer 110 are etched and an indented outer surface 103$s$ of the spacers are indented with respect to the Ge outer surface 104$s$ of the containing layer (or SiGe).

It is to be understood that other applications can be utilized which include features of examples as disclosed herein.

Although this disclosure describes particular process/method steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for processing a semiconductor substrate, the method comprising:
    receiving the semiconductor substrate that comprises a film stack, the film stack comprising a first germanium-containing layer, a second germanium-containing layer, and a first silicon layer positioned between the first germanium-containing layer and the second germanium-containing layer;
    removing an oxide layer from the film stack and forming a termination layer on the first germanium-containing layer and the second germanium-containing layer by:
        treating the film stack with a treatment gas comprising fluorine and oxygen, and
        heat-treating the film stack; and
    exposing the film stack to a plasma comprising fluorine and nitrogen, the plasma selectively etching the first silicon layer and converting the termination layer to an etch protection layer that inhibits etching of the first germanium-containing layer and the second germanium-containing layer during exposure of the film stack to the plasma.

2. The method of claim 1, wherein the exposing the film stack to the plasma includes:
    exposing the film stack to a first plasma comprising nitrogen but not fluorine, and
    exposing the film stack to a second plasma comprising the fluorine and the nitrogen.

3. The method of claim 2, further comprising sequentially repeating at least once the steps of exposing the film stack to the first plasma and exposing the film stack to the second plasma.

4. The method of claim 2, wherein the exposing the film stack to the first plasma and the exposing the film stack to the second plasma comprises:
    forming the first plasma with nitrogen and hydrogen, and exposing the film stack to the first plasma for a predetermined amount of time, and
    after the predetermined amount of time, continuing to introduce the nitrogen and hydrogen and also introducing fluorine to form the second plasma,
    the second plasma being continuous with the first plasma.

5. The method of claim 4, wherein the predetermined amount of time is 5 seconds or longer.

6. The method of claim 4, wherein the predetermined amount of time is in a range from 5 seconds to 25 seconds, and after the predetermined amount of time, the fluorine containing gas is introduced.

7. The method of claim 1, wherein the treating is performed in the absence of a plasma, wherein the treatment gas includes aerosolized water or water vapor, and wherein the plasma further comprises hydrogen.

8. The method of claim 2, wherein the first plasma is generated from gases comprising nitrogen and hydrogen and without fluorine, and the second plasma is formed with gases comprising nitrogen, hydrogen and fluorine.

9. The method of claim 1, wherein the plasma is generated from a gas combination comprising:
    nitrogen trifluoride ($NF_3$) and ammonia ($NH_3$);
    $NF_3$, $NH_3$, and nitrogen ($N_2$);
    $NF_3$, $NH_3$, and argon (Ar);
    $NF_3$ and hydrogen ($H_2$);
    $NF_3$, $H_2$, and $N_2$; or
    $NF_3$, $H_2$, $NH_3$, and $N_2$.

10. The method of claim 1, wherein the etch protection layer formed on exposed surfaces of the first germanium-containing layer and the second germanium-containing layer comprises germanium nitride.

11. The method of claim 1, wherein the first germanium-containing layer and the second germanium-containing layer are both germanium layers or are both silicon-germanium layers,
wherein the plasma selectively etching the first silicon layer comprises selectively etching an end portion of the first silicon layer to form an indent in the film stack between the first germanium-containing layer and the second germanium-containing layer,
as the first silicon layer is selectively etched, additional surfaces of the first germanium-containing layer and the second germanium-containing layer are exposed, and the plasma forms a passivation layer on the additional surfaces.

12. A method for processing a substrate comprising:
providing the substrate having a Ge containing layer and a Si containing layer, one of the Ge containing layer or the Si containing layer being above another of the Ge containing layer or the Si containing layer, the Si containing layer including either no Ge or Ge in a percentage amount lower than the Ge containing layer, and wherein the Ge containing layer and the Si containing layer each have an oxide on side surfaces;
performing a non-plasma treatment which removes the oxide from side surfaces of the Si containing layer and which provides a modified surface on side surfaces of the Ge containing layer; and
performing a plasma process which etches side surfaces of the Si containing layer and which converts the modified surface of the Ge containing layer to a protective surface which includes germanium nitride to prevent etching of the Ge containing layer.

13. The method according to claim 12, wherein the plasma process comprises:
forming a first plasma with a nitrogen containing gas which does not include fluorine;
exposing the substrate to the first plasma for 5 seconds or longer;
after the exposing to the first plasma, introducing fluorine to the first plasma while continuing to supply the nitrogen containing gas to form a second plasma; and
exposing the substrate to the second plasma.

14. The method according to claim 12, wherein after the plasma process, the Si containing layer is indented with respect to the Ge containing layer so that an outer dimension of the Si containing layer is smaller than an outer dimension of the Ge containing layer.

15. The method according to claim 12, wherein the non-plasma treatment includes:
a treatment with a fluorine containing gas and a hydrogen containing gas, to form the modified surface on side surfaces of the Ge containing layer; and
raising a temperature of the substrate to perform a heat treatment,
wherein the modified surface includes hydrogen, silicon, germanium and fluorine,
wherein during a first part of the plasma process, the modified surface reacts with nitrogen in a plasma to form the protective surface which includes germanium nitride, the plasma during the first part of the plasma process not including a halogen, and
wherein during a second part of the plasma process, fluorine is introduced into the plasma and the Si containing layer is etched while the Ge containing layer is protected by the protective surface.

16. The method according to claim 15, wherein the hydrogen containing gas includes aerosolized water or water vapor, and
the heat treatment removes water residues and removes residual oxide layer portions remaining on side surfaces of the Si containing layer while the modified surface on side surfaces of the Ge containing layer is not removed.

17. A method for selective etching comprising:
providing a substrate having a Ge containing layer and an Si containing layer, the Ge containing layer having a larger percentage of Ge than the Si containing layer,
wherein one of the Ge containing layer or the Si containing layer is vertically above another of the Ge containing layer or the Si containing layer, and wherein a side surface layer is on side surfaces of both the Ge containing layer and the Si containing layer;
treating the side surface layer in a non-plasma with process gases which include hydrogen, oxygen and fluorine;
after the treating, selectively sublimating portions of the side surface layer so that after the selectively sublimating the side surface layer is removed from side surfaces of the Si containing layer, and a modified side surface layer is present on side surfaces on the Ge containing layer;
after the selectively sublimating, exposing the substrate to a first plasma which includes hydrogen and nitrogen and which does not include a halogen or oxygen; and
after the exposing to the first plasma, exposing the substrate to a second plasma which includes hydrogen, nitrogen and a halogen.

18. The method of claim 17, wherein the modified side surface layer includes hydrogen, silicon, germanium and fluorine,
the substrate is exposed to the first plasma for a first time period in a range of 5 seconds to 25 seconds,
the substrate is exposed to the second plasma for a second time period in a range of 8 seconds to 25 seconds,
after the second time period, at least one of plasma power is turned off or introduction of the halogen is discontinued for a third time period, and hydrogen and nitrogen continue to be introduced during the third time period,
after the third time period, plasma power is turned on and the halogen is introduced for a fourth time period in a range of 8 seconds to 25 seconds.

19. The method of claim 18, wherein the halogen includes fluorine, and during the second time period a ratio of fluorine to nitrogen introduced is in a range from 1:5 to 1:10,
during the first time period and the second time period, oxygen is not introduced, and temperature is maintained in a range of −50° C. to 25° C.

20. The method according to claim 17, wherein the treating is performed in a first process chamber, the selectively sublimating is performed in a second process chamber, and the exposing to the first and second plasmas is performed in a third process chamber.

* * * * *